United States Patent [19]

Malaurie et al.

[11] Patent Number: 5,050,038
[45] Date of Patent: Sep. 17, 1991

[54] HEAT SINK DEVICE OR SURFACE MOUNT TYPE COMPONENT MOUNTED ON A PRINTED CIRCUIT BOARD

[75] Inventors: Claude Malaurie, Ermont; Joël Bertet, Sartrouville, both of France

[73] Assignee: Alcatel Business Systems, Paris, France

[21] Appl. No.: 550,849

[22] Filed: Jul. 10, 1990

[30] Foreign Application Priority Data

Jul. 10, 1989 [FR] France ................................ 89 09246

[51] Int. Cl.⁵ ............................................. H05K 7/20
[52] U.S. Cl. .................................. 361/386; 174/35 R; 357/81; 361/388; 361/424
[58] Field of Search .............................. 361/386–389, 361/424; 174/35 R, 16.3; 357/81, 84

[56] References Cited

U.S. PATENT DOCUMENTS 4,254,447  3/1981  Griffis ................................ 361/389
4,945,451  7/1990  Gohl et al. ........................ 361/388

FOREIGN PATENT DOCUMENTS 0139431  5/1985  European Pat. Off. .
3128856  2/1983  Fed. Rep. of Germany .

OTHER PUBLICATIONS

IBM Technical Disclosure Bulletin, vol. 28, No. 11, Apr. 1986, pp 4723–4725; "Stiffened Card with Integrated Circuit".

Primary Examiner—Gregory D. Thompson
Attorney, Agent, or Firm—Sughrue, Mion, Zinn Macpeak & Seas

[57] ABSTRACT

A device for dissipating heat for a surface mount component assembled onto a printed circuit board is made up by a metallic plate deposited on the rear of the substrate under the surface mount component. A thermal coupling device is made up by a small heat collecting plate provided on the front side of the substrate and the actual substrate. The heat collecting plate also performs an electro-magnetic shielding function and is advantageously constituted either by the shielding plate normally provided for this purpose or by an extension thereof.

3 Claims, 1 Drawing Sheet

HEAT SINK DEVICE OR SURFACE MOUNT TYPE COMPONENT MOUNTED ON A PRINTED CIRCUIT BOARD

SUMMARY OF THE INVENTION

1. Field of the Invention

The present invention relates to a heat sink device for a surface mount component (SMC) mounted on a printed circuit board, in particular on a printed circuit board fitted into an electronic telephone set.

2. Brief Description of Prior Art

FIG. 1 in the attached drawings is a diagrammatical illustration of the present technique. This example shows a transistor 1, of the surface mount type, mounted on a printed circuit board 2 or substrate, having the conventional thickness of around 1.5 millimeters, the transistor having an emitter electrode 4, a base electrode 3 and a collector electrode which, as is generally the case for this type of surface mount component is made up by two terminals 5 and 6 which are separate but mutually connected electrically. The emitter 4 and base 3 electrodes are respectively soldered onto two coppers tracks or connections 8 and 7.

In order to provide for the desired removal of heat, the two collector terminals 5 and 6 are respectively soldered onto two copper heat dissipating surfaces 9 and 10, forming heat sinks, which are deposited onto the insulating substrate 2 and which, in this example, have an overall shape of a flat disc with a total surface areas. A collector connection 14 is soldered onto the heat sink 9.

Additionally, although this is not always the case, a thin copper sheet 11 is deposited over the major portion of the side 12 of the substrate 2 opposing the side 13 which receives all the electrical components of the printed circuit, such as transistor 1, the connections 7, 8, 14 and the heat sink 9, 10. This thin copper sheet 11 which in this example does not extend to right under the transistor 1 and its heat sink 9, 10 is a electromagnetic shielding plate which is highly useful in particular in the case of printed circuit for telephone sets in order to shield against transmitted or received electromagnetic fields.

Furthermore, in order to, in general terms, encourage dissipation of the internal heat from components, it is current practice to increase, to the extent that this is possible, the width of the connection tracks.

These known methods for evacuating heat suffer from the drawback of increasing the surface area occupied by the electrical components of the printed circuit, thus increasing in a prejudicial manner cost and space requirements. It is true that this surface area could be reduced by using heat sinks bonded onto the surface mount component but such a solution would be expensive and highly difficult to apply correctly.

SUMMARY OF THE INVENTION

The invention aims to overcome these disadvantages. To achieve this, the invention provides a heat sink device for a surface mount component mounted on an electrically insulating piece of printed circuit board (or substrate), in which the heat sink includes, a first metallic plate deposited substantially under the surface mount component and on the side of the substrate opposing the side which receives said component, and, a second metallic plate in juxtaposition with or closely surrounding at least partially the component. Further, the second metallic plate is soldered to at least one of the thermal dissipation leads of the surface mount component, deposited on the side of the substrate that receives said component, at least partially under the projection of at least a portion of said first metallic plate. The second metallic plate has a total surface area (s) which is equal to a fraction of the total surface area (S) of the first metallic plate which, alone, would be suitable to perform the same amount of thermal dissipation if it were conventionally deposited on the same side as the surface mounted component in an at least partial close surrounding relation thereto and were soldered to this same or these same thermal dissipation leads.

Preferably, the surface area (s) of this second metallic plate is of the order of one quarter of the above-defined surface area (S) of the first metallic plate for a conventional substrate of the usual thickness of the order of 1.5 millimeters.

BRIEF DESCRIPTION OF THE DRAWINGS

Other objects, advantages and features of the invention will be described from the following description of two embodiments of the invention provided by way of non-limiting illustration with reference to the attached drawings in which.

DETAILED DESCRIPTION OF PREFERRED EMBODIMENTS

Figure 2:
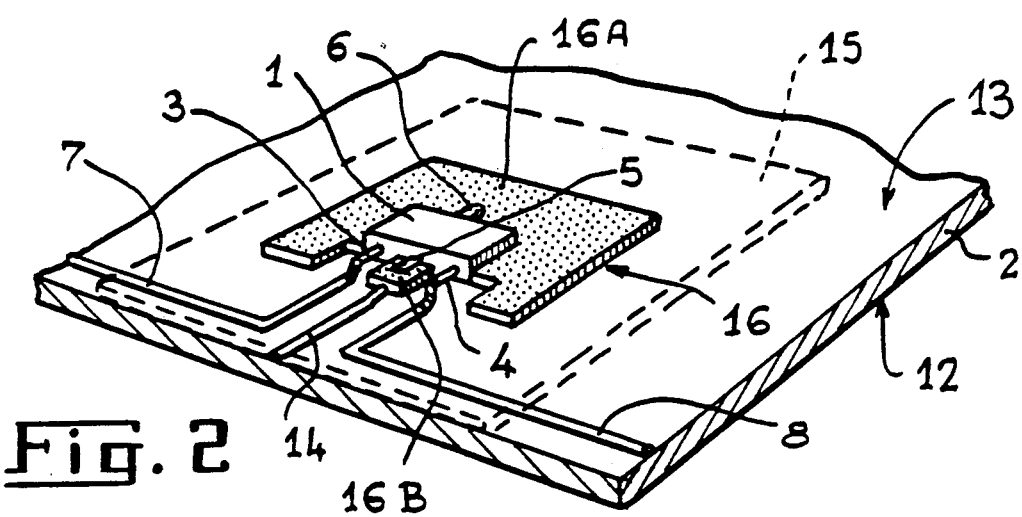
FIG. 2 is a schematic perspective view partially cut away of a first embodiment of this new heat sink device.

With reference now to FIG. 2, the substrate 2 of conventional thickness of about 1.5 millimeters will be recognized together with the surface mount transistor 1 with its respective emitter and base electrodes 4 and 3, and its collector terminals 5, 6, which can be considered as its heat dissipating terminals.

The invention is based on the observation that if the material of which a substrate 2 of a printed circuit board is conventionally constituted is designed to be electrically insulating, it is on the other hand not in any way designed to be thermally insulating which would moreover be much too expensive. Since we are moreover dealing with boards of relatively small thickness (1.5 millimeters in general), they can, although this is not at all their original purpose, be employed finally as thermal transmission parts. According to the invention, heat dissipation is in fact achieved by means of a relatively wide heat dissipating, first metallic plate 15 that is deposited on the board 2 on the side opposite transistor 1, i.e. on the side 12, and transmission to this first plate 15 of heat energy from the transistor and its dissipating terminals 5 and 6 is achieved by the use of a thermal coupling device made up firstly by the actual substrate 2 and, secondly, by a heat collecting, second metallic plate 16 which closely surrounds practically the whole of transistor 1.

This heat collecting plate 16 is a metallic plate which is deposited onto the same side 13 of the substrate 2 as the transistor 1 (while the first plate 15 is deposited on the opposite side 12), and which in fact is made by two parts 16a and 16b in order to allow a path for the connections or tracks 7 and 8. Its total surface area (s) is equal to a fraction of the abovesaid surface area (S) of the planar heat sink (9, 10, FIG. 1) of the prior art and preferably is of the order of one-quarter of this surface area (S).

This first metallic plate 15 can also (like the plate 11 in FIG. 1) perform a function of electromagnetic screening, and can even be simply constituted by the electromagnetic shielding plate already provided on this circuit.

Figure 1:
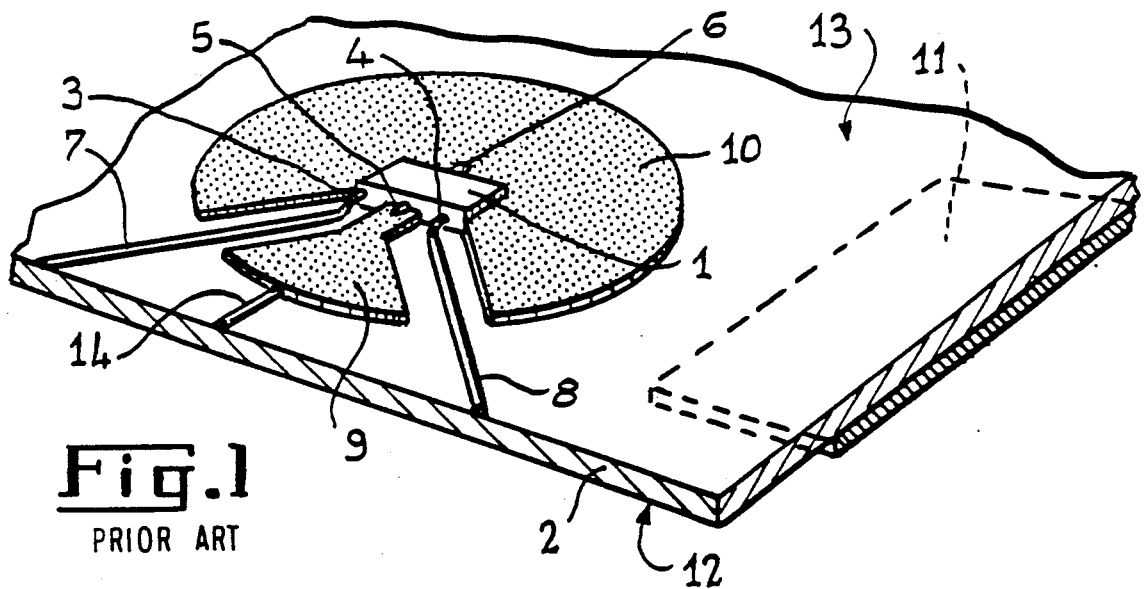
FIG. 1 discussed above, illustrates the prior art.
Figure 3:
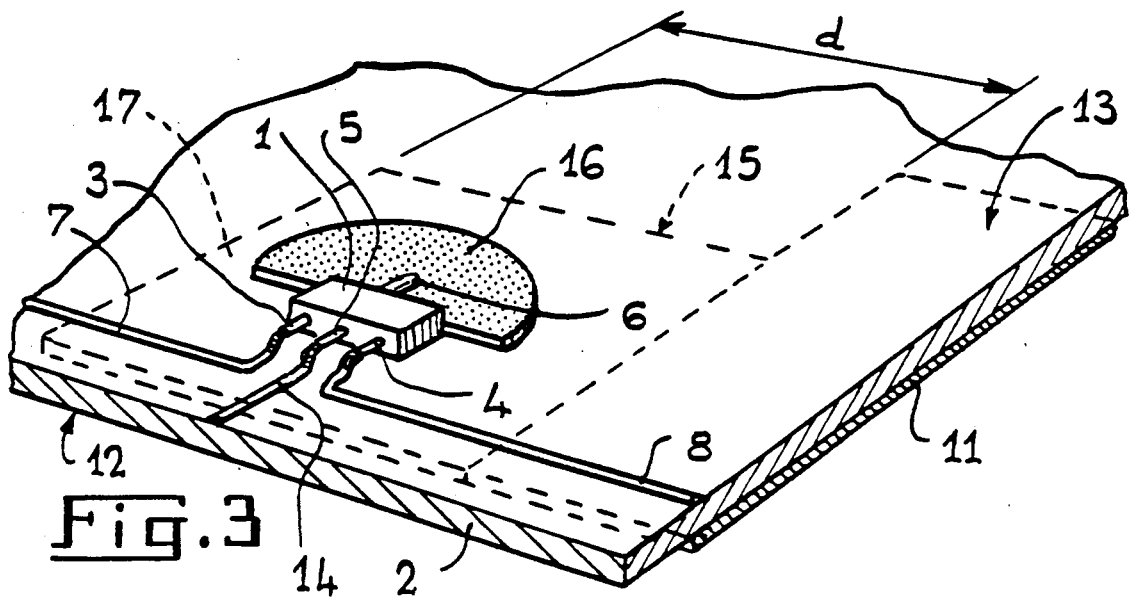
FIG. 3 is a similar view of a second embodiment of this same heat sink device.

The embodiment in FIG. 3 differs from the one in FIG. 2 by the fact that the heat collecting plate 16 has, by way of illustration of another shape of the thermal coupling part, a semi-circular shape juxtaposed against one single side of transistor 1, but soldered to the collector terminal 6 thereof, and by the fact that the heat dissipating plate 15 is simply made up, compared to the embodiment in FIG. 1 which includes an electromagnetic screening plate 11 which is not situated under the transistor 1, by a extension 17 of this electromagnetic screening plate 11 by a length d which is sufficient for this screening first plate 15 to extend right below the transistor 1 and the heat collecting plate thermal coupling element 16.

It should be noted, as shown is the figures, that the connections or tracks 7, 8, 14 can be narrower than those generally provided on conventional circuits such as the one shown in FIG. 1, provided obviously that they are nevertheless wide enough in order to be able to handle the required current density.

Obviously, the invention is not limited to the embodiments which have just been described. Thus, the thermal coupling element or heat collecting, second metallic plate 16, superimposed on first metallic plate 15, could have another shape instead of a rectangle (FIG. 2) or an arc of a circle (FIG. 3). The heat dissipating first plate 15 itself is preferably chosen to be very wide all the more so because this plate must frequently also provide an electromagnetic shielding effect. This doesn't however prevent it, if only its heat application function is considered, from having dimensions that are substantially equal to the dimensions of heat sink 9, 10 (FIG. 1) of the prior art, or even smaller that the above provided that these dimensions are sufficient to perform the function of thermal dissipation. The term "metallic plate" should be taken to mean a plate made of actual metal or, obviously, any other material that is equivalent from the point of view of its thermal conduction properties.

What is claimed is:

1. A thermally protected surface mount component and printed circuit board mounting arrangement comprising:

a printed circuit board;

first and second metallic heat dissipating plates, located face to face on opposite sides of the printed circuit board and being thermally linked together through said printed circuit board, said second metallic heat dissipating plate surrounding the surface mount component and being connected to said surface mount component through at least one heat lead on one side of said printed circuit board, said first metallic heat dissipating plate being located on the other side of said printed circuit board and having a surface area larger than the surface area of said second metallic heat dissipating plate, and wherein said second metallic heat dissipating plate is superimposed on said first metallic heat dissipating plate.

2. The mounting arrangement according to claim 1, wherein said printed circuit board has a thickness which is on the order of 1.5 mm and wherein the surface area of the first metallic heat dissipating plate is at least approximately three times larger than said second metallic heat dissipating plate surrounding the surface mount component.

3. The mounting arrangement according to claim 1, wherein the larger surface area first metallic heat dissipating plate constitutes a metallic electromagnetic shield for said surface mount component and said second metallic heat dissipating plate.

* * * * *